(12) United States Patent
Zhang et al.

(10) Patent No.: US 10,831,487 B2
(45) Date of Patent: Nov. 10, 2020

(54) LOOKUP-TABLE HARDWARE SEARCH ENGINE

(71) Applicant: Dalian University of Technology, Liaoning (CN)

(72) Inventors: Jianwei Zhang, Liaoning (CN); Guoqiang Wu, Liaoning (CN); Xiaoming Chen, Liaoning (CN); Yan Yu, Liaoning (CN)

(73) Assignee: DALIAN UNIVERSITY OF TECHNOLOGY, Dalian (CN)

( * ) Notice: Subject to any disclaimer, the term of this patent is extended or adjusted under 35 U.S.C. 154(b) by 0 days.

(21) Appl. No.: 16/304,607

(22) PCT Filed: Dec. 22, 2017

(86) PCT No.: PCT/CN2017/117918
§ 371 (c)(1),
(2) Date: Nov. 26, 2018

(87) PCT Pub. No.: WO2019/119395
PCT Pub. Date: Jun. 27, 2019

(65) Prior Publication Data
US 2019/0278604 A1    Sep. 12, 2019

(51) Int. Cl.
*G06F 9/30* (2018.01)
*G11C 15/04* (2006.01)
*G06F 16/901* (2019.01)
*H04L 12/743* (2013.01)

(52) U.S. Cl.
CPC ...... *G06F 9/30196* (2013.01); *G06F 9/30029* (2013.01); *G06F 16/9017* (2019.01); *G11C 15/04* (2013.01); *H04L 45/7457* (2013.01)

(58) Field of Classification Search
CPC ............. G06F 9/30196; G06F 9/30029; G06F 16/9017; G06F 16/90339; G11C 15/04; H04L 45/7457
See application file for complete search history.

(56) References Cited

U.S. PATENT DOCUMENTS

| 7,274,581 | B1 * | 9/2007 | Powell | ............... G11C 15/00 365/200 |
| 2011/0096582 | A1 * | 4/2011 | Arsovski | ............... G11C 15/04 365/49.11 |
| 2015/0200011 | A1 * | 7/2015 | Arsovski | ............. G06F 11/1064 365/49.11 |
| 2017/0153835 | A1 * | 6/2017 | Miki | ..................... G06F 3/0625 |

* cited by examiner

*Primary Examiner* — Jerome Leboeuf
(74) *Attorney, Agent, or Firm* — Hauptman Ham, LLP

(57) ABSTRACT

A lookup-table type TL-TCAM hardware search engine includes a SL decoder, a TL-TCAM array, and the data stored in the TL-TCAM hardware search engine is obtained by performing lookup table operation in the corresponding TCAM hardware search engine, the SL decoder is used to decode the search word and send it to the TL-TCAM hardware search engine array, and the decoding is to convert a search word SL corresponding to data in a TCAM hardware search engine table into a search word LSL corresponding to TL-TCAM hardware search engine table data, the effect is that TCAM adds a decoder, cooperates with the decoder and by lookup table method converts the TCAM table data to a new circuit unit that can be adapted to the added search line.

9 Claims, 3 Drawing Sheets

Figure 9
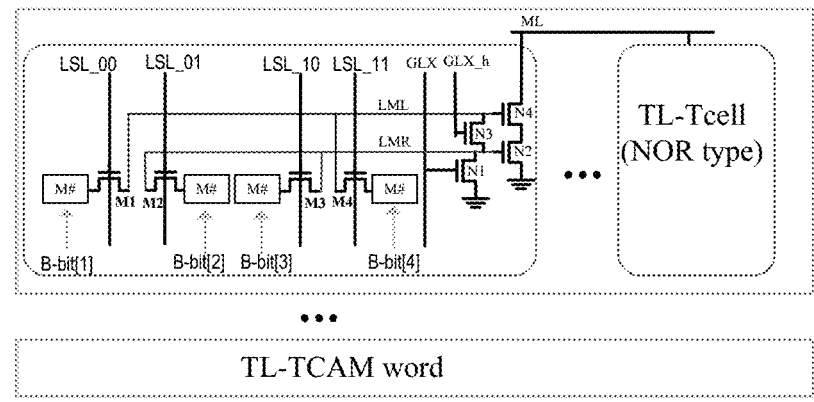
Figure 10
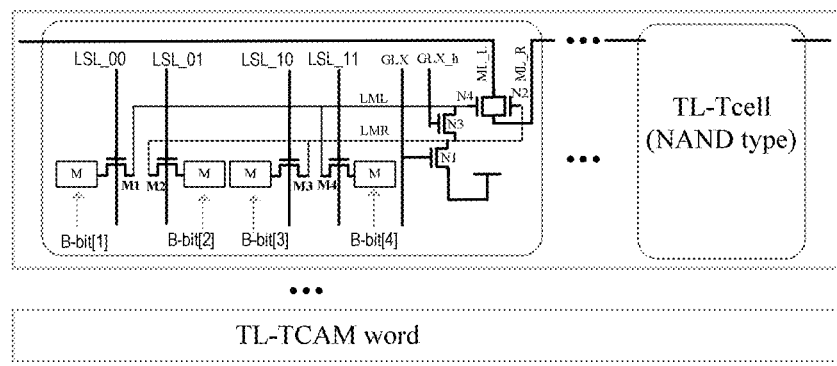
Figure 11
Figure 12

LOOKUP-TABLE HARDWARE SEARCH ENGINE

RELATED APPLICATIONS

The present application is a National Phase of International Application Number PCT/CN2017/117918, filed Dec. 22, 2017.

TECHNICAL FIELD

The invention belongs to the field of information technology, and relates to a hardware search engine.

BACKGROUND TECHNOLOGY

TCAM (Ternary Content-Addressable Memory) is a high-speed hardware search engine, which is widely used in search-intensive operations, such as backbone/edge network routers in the Internet, to achieve routing table lookup and packet forwarding.

BiCAM (Binary CAM) can only store 1-bit data, i.e., 0 or 1. TCAM can store three values of 0, 1, and X, where X is a wildcard, which can represent 0 or 1. According to the working principle, match lines of TCAM are mainly divided into two types, NOR and NAND, as shown in FIG. 1. The match line is mainly composed of storage unit, match line ML, search line SL, comparator transistors M1-M4. The storage unit is 6-T SRAM units. FIG. 1 omits 2-T read-write access transistors, the function description of TCAM unit circuit is shown in Table 1.

TABLE 1

Encoding representation of TCAM unit circuit

| NOR type TCAM unit | | | NAND type TCAM unit | | |
|---|---|---|---|---|---|
| Representation value | Node value (D, D#) | Search value (SL, SL#) | Representation value | Node value (D, M) | Search value (SL, SL#) |
| 0 | (0, 1) | (0, 1) | 0 | (0, 0) | (0, 1) |
| 1 | (1, 0) | (1, 0) | 1 | (1, 0) | (1, 0) |
| X | (1, 1) | (0, 0) | X | (0, 1) | (1, 1) |
| reserved | (0, 0) | (1, 1) | X | (1, 1) | (1, 1) |

The NOR type TCAM word circuit is composed of NOR type TCAM units connected in parallel. The NAND type TCAM word circuit is composed of NAND type TCAM units connected in series. As seen from FIG. 2, the NOR type match line structure is to connect the match line ML of NOR type TCAM units in parallel, while the NAND type match line is to connect the NAND type TCAM units in serial. The TCAM is composed of an array of word circuits, a decoder and a priority encoder, as seen from FIG. 3. When TCAM works, all the word circuits are activated at the same time, resulting in high power consumption of TCAM. A typical TCAM chip consumes power of about 25 watts. How to reduce power consumption without affecting the search speed is a major research direction for domestic and foreign scholars.

In 2007, N. Mohan et al. proposed a NOR type TCAM unit structure with low parasitic capacitance (see [1] N. Mohan, et al., "Low-capacitance and charge-shared match lines for low-energy high-performance TCAMs," IEEE JSSC, Vol. 42, No. 9, PP. 2054-2060, September 2007), as shown in FIG. 4. The match line ML connects only one transistor M1, while the ML of the traditional 16T NOR type TCAM unit (see FIG. 1 (a)) connects two transistors M1 and M2. The parasitic capacitance is reduced, the power consumption is reduced, and the speed of the circuit is accelerated.

Inventors continue to study on this circuit and find that if TCAM unit Tcells are combined every 2 tow and optimized to form a new circuit unit TL-Tcell, the match line's parasitic capacitance can be reduced by half, the probability of the search line flipping power consumption can be reduced by half, and the search performance can be greatly improved. The data stored in the TL-Tcell unit needs to be processed from the TCAM.

SUMMARY

In order to reduce the parasitic capacitance of match lines, reduce the power consumption probability of the search lines inversion and improve the searching performance, the present invention proposes the following scheme: a lookup-table TL-TCAM hardware search engine, including a SL decoder and a TL-TCAM array, the data stored in the TL-TCAM hardware search engine is obtained by looking up table of the data stored in the corresponding TCAM hardware search engine, the decoder is configured to decode the search word and send the search word to TL-TCAM hardware search engine array, the decode is used to convert the search word SL corresponding to the data in the TCAM hardware search engine table to a search word LSL corresponding to the TL-TCAM hardware search engine table data.

Advantageous Effects: The present invention can reduce the parasitic capacitance of the match line, reduce the power consumption possibility of the search line inversion, and improve the searching performance. The data stored in the TL-Tcell unit needs to be obtained by looking up table from TCAM.

BRIEF DESCRIPTION OF THE DRAWINGS

FIG. 1 is a schematic diagram of the TCAM unit, wherein.

FIG. 2 is a schematic structural diagram of the TCAM word circuit, wherein.

FIG. 9 is a schematic diagram of the word circuit of of the NOR type TL-TCAM hardware search engine.

FIG. 10 is a schematic diagram of the word circuit of of the NAND type TL-TCAM hardware search engine.

FIG. 11 is a schematic diagram of table division of the TCAM hardware search engine.

FIG. 12 is a schematic diagram of table division of TL-TCAM hardware search engine.

DETAILED EMBODIMENTS

Figure 1A:
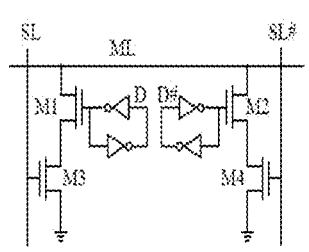
FIG. 1(a) is NOR type TCAM unit, FIG. 1 (b) is NAND type TCAM unit.

The present invention defines or translates some terms used in it: TCAM (Ternary Content-Addressable Memory)

is a hardware search engine; TL-TCAM is an improved hardware search engine of the present invention.

In one example, a lookup-table type TL-TCAM hardware search engine includes a SL decoder, a TL-TCAM array, wherein the data stored in the TL-TCAM hardware search engine is obtained by looking up table of the data stored in the corresponding TL-TCAM hardware search engine, and the decoder is configured to decode the search word and send the search word to the TL-TCAM array, the decode is to convert the search word SL corresponding to the data in the TCAM hardware search engine table to a search word LSL corresponding to the TL-TCAM hardware search engine table data.

In one embodiment, the data stored in the TL-TCAM hardware search engine is obtained by looking up table of the data stored in the corresponding TCAM hardware search engine, and the data of the TCAM hardware search engine is obtained by mapping data stored in TL-TCAM hardware search engine: Thus, the following embodiment will specifically clarify the data conversion mode of TL-TCAM hardware search engine of the present invention and the existing TCAM hardware search engine:

Each bit in the TCAM hardware search engine table (named as T-bit) is ternary, which can be 0, 1, and X. In circuit implementation, it is actually composed of 2 bit SRAM, namely T-bit=(SRAM1, SRAM2), e.g., 0=(0, 1), 1=(1, 0), X=(0, 0).

The TL-TCAM hardware search engine divides TCAM table evenly, every two T-bits form a group (T_block) in each word circuit (one row is called a word circuit), as shown in FIG. 11. Note that each T-bit here is ternary.

FIG. 11 shows the way to split the TCAM hardware search engine table. In the word circuit, every two T-bits form a group T_block. T-bit is ternary, i.e., T-bit=(SRAM1, SRAM2).

Then convert each T_block to TL_block of TL-TCAM, as shown in FIG. 12. Note that each B-bit here is binary.

FIG. 12 shows an example of the content of a TL-TCAM hardware search engine table. The size of each block TL_block is 1 row×4 columns, where B-bit is binary. Therefore, the storage capacity of T_block and TL_block is same.

The main operations of the conversion are as follows:

Perform the following operations for each T_block:

Using 00 to perform lookup table operation in T_block and the result of whether match is taken as the first binary bit B-bit value in TL_block (named as B-bit[1]). B-bit[1]=1 for "match", otherwise B-bit[1]=0.

Using 01 to perform lookup table operation in T_block and the result of whether "match" is taken as the second binary bit B-bit value in TL_block (named as B-bit[2]). B-bit[2]=1 for "match", otherwise B-bit[2]=0.

Using 10 to perform lookup table operation in T_block and the result of whether "match" is taken as the third binary bit B-bit value in TL_block (named as B-bit[3]). B-bit[3]=1 for "match", otherwise B-bit[3]=0.

Using 11 to perform lookup table operation in T_block and the result of whether "match" is taken as the fourth binary bit B-bit value in TL_block (named as B-bit[4]). B-bit[4]=1 for "match", otherwise B-bit[4]=0.

The pseudo code for conversion from TCAM to TL-TCAM is described as follows:

```
TCAM block(T_block) --> TL-TCAM block
        (TL_block) conversion pseudo code Input: T-bit::Ternary value in T_block
Output: B-bit::Binary value in corresponding TL-block.
  1:   B-bit[1] = (00 match T-bit[0:1]) ? 1: 0;
  2:   B-bit[2] = (01 match T-bit[0:1]) ? 1: 0;
  3:   B-bit[3] = (10 match T-bit[0:1]) ? 1: 0;
  4:   B-bit[4] = (11 match T-bit[0:1]) ? 1: 0;
```

It should be noted that since one ternary bit of TCAM is actually composed of 2 bits SRAM, the transformation from TCAM to TL-TCAM does not cause any additional bit increase, i.e. no additional area increase.

Conversely, the data in the table of TL-TCAM hardware search engine can be converted into data in the table of TCAM hardware search engine.

The main process of conversion is as follows:

Perform the following operations for each TL_block:

Generate two data A and B, where A is "OR" value of the first and the second column of TL_block, and B is "OR" value of the third and the fourth column of TL_block.

IF {A, B}=11, the value of the first column of the TCAM table T-bit[1]=X;

IF {A, B}=10, the value of the first column of the TCAM table T-bit[1]=0;

IF {A, B}=01, the value of the first column of the TCAM table T-bit[1]=1;

Regenerate two data M and N, where M is "OR" value of the first and the third column of TL_block, and N is "OR" value of the second and the fourth column of TL_block.

IF {M, N}=11, the value of the second column of the TCAM table T-bit[2]=X;

IF {M, N}=10, the value of the second column of the TCAM table T-bit[2]=0;

IF {M, N}=01, the value of the second column of the TCAM table T-bit[2]=1;

The pseudo code of table data conversion from TL-TCAM to TCAM is as follows:

```
TL-TCAM block (TL_block)→TCAM block
       (T_block) conversion pseudo code

Input: B-bit::Binary value in TL_block.
Output: T-bit::Ternary value in corresponding T_block.
  1:  A=B-bit[1] + B-bit[2];
  2:  B=B-bit[3] + B-bit[4];
  3:  case ({A,B})      11: T-bit[1]= X;
  4:                    10: T-bit[1]= 0;
  5:                    01: T-bit[1]= 1;
  6:  end case
  7:  M=B-bit[1] + B-bit[3];
  8:  N=B-bit[2] + B-bit[4];
  9:  case ({M,N})      11: T-bit[2]= X;
 10:                    10: T-bit[2]= 0;
 11:                    01: T-bit[2]= 1;
 12:  end case
```

Figure 5:
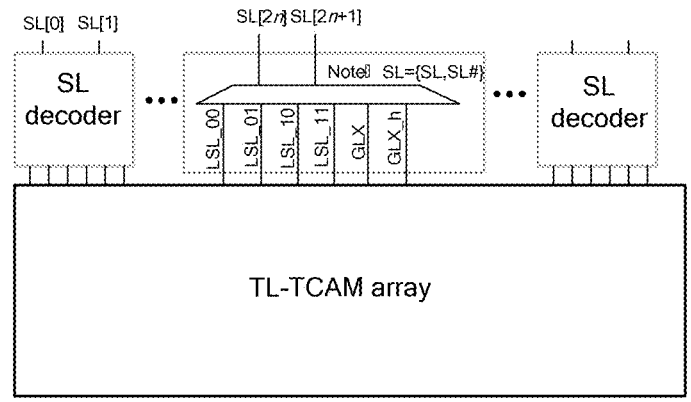
FIG. 5 is a schematic diagram showing an example of data interchanging between TCAM and TL-TCAM.

FIG. 5 shows the example of data conversion between different hardware search engines.

Figure 6:
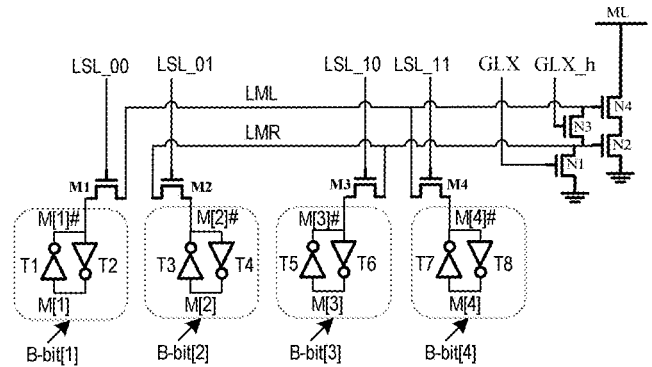
FIG. 6 is a circuit block diagram of the TL-TCAM hardware search engine.

In one example, as can be seen from the circuit of the TL-TCAM hardware search engine in FIG. 6, because the data in TL-TCAM hardware search engine is converted from the TCAM hardware search engine, the search word SL sent to the TL-TCAM array needs to be decoded. T_block corresponding to TCAM hardware search engine, the search line SL is decoded every 2 bits.

The TL-TCAM array is mainly composed of word circuits of TL-TCAM hardware search engine. Each word circuit is mainly composed of many NOR type TL-TCAM hardware search engine units (NOR TL-Tcells) connected in parallel on the match line ML, or many NAND type TL-TCAM hardware search engine units (NAND TL-Tcells) connected in serial, TL-Tcells are connected to the decoder by search data lines and global mask lines.

In one example, the function pseudo code of the SL decoder is described as follows:

SL decoder funciton:

Input: SL[2n:2n+1]:: traditional TCAM SL value, ternary value for very bit
output: LSL_00, LSL_01, LSL_10, LSL_11, GLX, GLX_h :: local TL-TCAM SL value, binary value for every bit
1:   if(SL[2n:2n+1]={X,X}) : //two global X
2:       LSL_00=LSL_01=LSL_10=LSL_11=0;
3:       GLX=1;GLX_h=1;
4:   else If ( (SL[2n:2n+1]={X,0}) or ( (SL[2n:2n+1]={X,1})
5:           or (SL[2n:2n+1]={0,X}) or ( (SL[2n:2n+1]={1,X}) ) : //only one global X
6:       LSL_00=( (SL[2n:2n+1]={0,X}) or (SL[2n:2n+1]={X,0}) ) ? 1:0;
7:       LSL_01=( (SL[2n:2n+1]={0,X}) or (SL[2n:2n+1]={X,1}) ) ? 1:0;
8:       LSL_10=( (SL[2n:2n+1]={1,X}) or (SL[2n:2n+1]={X,0}) ) ? 1:0;
9:       LSL_11=( (SL[2n:2n+1]={1,X}) or (SL[2n:2n+1]={X,1}) ) ? 1:0;
10:        GLX=0;GLX_h=0;
11:  else //no global X
12:      LSL_00=(SL[2n:2n+1]={0,0})? 1:0;
13:      LSL_01=(SL[2n:2n+1]={0,1} ? 1:0;
14:      LSL_10=(SL[2n:2n+1]={1,0} ? 1:0;
15:      LSL_11=(SL[2n:2n+1]={1,1} ? 1:0;
16:      GLX=0;GLX_h=1;
17:  end if The description of the decoder is described as follows:

(1) If there are two global X in SL[2n:2n+1], ie {XX}, the search data line LSL_00, LSL_01, LSL_10, LSL_11 are all zero, and the global mask lines GLX and GLX_h are both 1.

(2) If there is only one global X in SL[2n:2n+1] (ie {0X}, {1X}, {X0}, {X1}), global mask line GLX and GLX_h are 0, and the true values of search data line LSL_00, LSL_01, LSL_10, LSL_11 are shown in table 4:

TABLE 4

LSL decoding true value table
when only one global X in SL[2n:2n + 1]

| SL[2n:2n + 1] | LSL_00 | LSL_11 | LSL_10 | LSL_01 |
|---|---|---|---|---|
| 0X | 1 | | | 1 |
| 1X | | 1 | 1 | |
| X0 | 1 | | 1 | |
| X1 | | 1 | | 1 |

(3) If there is no global X in SL[2n:2n+1]:
Global mask lines GLX and GLX_h are all 0; if SL[2n:2n+1]=00, the search data line LSL_00=1; If SL[2n:2n+1]=01, the search data line LSL_01=1; If SL[2n:2n+1]=10, the search data line LSL_10=1; If SL[2n:2n+1]=11, the search data line LSL_11=1.

The unit circuit of the TL-TCAM array (TL-TCAM array) can be divided into NOR and NAND type according to the circuit structure.

Figure 7:
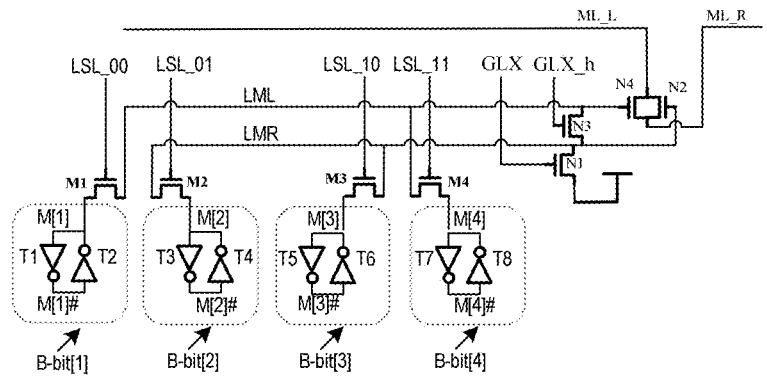
FIG. 7 is a schematic diagram of the unit circuit of the NOR type TL-TCAM hardware search engine.

TL-TCAM array is mainly composed of TL-TCAM hardware search engine word circuit (TL-TCAM word) as shown in FIG. 9. For NOR type unit circuit, each word circuit is composed of many TL-TCAM hardware search engine units (TL-Tcell) in parallel on the match line ML. M is the storage unit B-bit of TL-TCAM, and M # represents the logical NOT of M. M=1 means match, M=0 means mismatch. As shown in FIG. 7, NOR TL-Tcell includes inverters T1~T8, NMOS transistors M1~M4, NMOS transistors N1~N4, search data line LSL_00, LSL_01, LSL_10, LSL_11, global mask lines GLX, GLX_h, local match lines LML, LMR, global match line ML;

The input terminal of inverter T1 is connected to the output terminal of inverter T2 as the data storage terminal M[1] of B-bit[1], the output terminal of inverter T1 is connected to the input terminal of inverter T2 as the logical "NOT" data storage terminal M[1]# of B-bit[1], and the M # terminal is the logical "NOT" of the M terminal; the source of MOS transistor M1 is connected to the M[1]# terminal, and the gate of MOS transistor M1 is connected to the search data line LSL_00. and the drain of MOS transistor M1 is connected to the local match line LML.

The input terminal of inverter T3 is connected to the output terminal of inverter T4 as the data storage terminal M[2] of B-bit[2], the output terminal of inverter T3 is connected to the input terminal of inverter T4 as the logical "NOT" data storage terminal M[2]# of B-bit[2], the M[2]# terminal is the logical "NOT" of M[2], the drain of MOS transistor M2 is connected to the M[2]# terminal, and the gate of MOS transistor M2 is connected to the search data line LSL_01, and the source of MOS transistor M2 is connected to the local match line LMR.

The input terminal of inverter T5 is connected to the output terminal of inverter T6 as the data storage terminal M[3] of B-bit[3], the output terminal of inverter T5 is connected to the input terminal of inverter T6 as the logical "NOT" data storage terminal M[3]# of B-bit[3], M[3]# is the logical "NOT" of M[3], the source of MOS transistor M3 is connected to the M[3]# terminal, the gate of MOS transistor M3 is connected to the search data line LSL_10, and the drain of MOS transistor M3 is connected to the local match line LMR.

The input terminal of inverter T7 is connected to the output terminal of inverter T8 as the data storage terminal M[4] of B-bit[4], the output terminal of inverter T7 is connected to the input terminal of inverter T8 as the logical "NOT" data storage terminal M[4]# of B-bit[4], M[4]# is the logical "NOT" of M[4], the drain of MOS transistor M4 is connected to the M[4]# terminal, the gate of MOS transistor M4 is connected to the search data line LSL_11, the source of the MOS transistor M4 is connected to the local match line LML.

The gate of MOS transistor N1 is connected to the global mask line GLX, the source of MOS transistor N1 is grounded, the drain of MOS transistor N1 is connected to the match line LMR; the gate of MOS transistor N3 is connected to the global mask line GLX_h, the source of MOS transistor N3 is connected to the local match line LMR, and the drain of MOS transistor N3 is connected to the local match line LML; the gate of MOS transistor N2 is connected to the local match line LMR, the source of MOS transistor N2 is grounded; the gate of MOS transistor N4 is connected to the local match line LML, the source of MOS transistor N4 is connected to the drain of MOS transistor N2, and the drain of MOS transistor N4 is connected to the global match line ML.

The working principle of the NOR type unit circuit is as follows:

A. If there is no global X in SL[2n:2n+1]:

Global mask line GLX=0, GLX_h=1, NMOS transistor N1 is OFF, NMOS transistor N3 is ON, and the voltage of local match line LML equals to that of LMR;

According to the SL decoder, only one of the search data lines LSL_00, LSL_01, LSL_10, LSL_11 is 1, and the corresponding M # (that is, the B-bit "NOT") is sent; For example, SL[2n:2n+1]={0,0}, then LSL_00=1, M1 is ON, NOT value of B-bit[1] is sent to LML.

If M #=0 (M=1) is sent, the local match line LML=0 and LMR=0, NMOS transistor N2 and N4 are both OFF, and the search result of TL-Tcell is match. if the results of all TL-Tcell units in the word circuit are all match, the whole word circuits give a search result of match, since NMOS transistors N2 and N4 of all TL-Tcell are OFF, all the discharge channels of the global match line ML are OFF at this time; If M #=1 (M=0) is sent, the local match line LML=1 and LMR=1, NMOS transistor N2 and N4 are both ON, and search result of TL-Tcell is mismatch, if at least one of the results of all TL-Tcells in the word circuit gives a result of mismatch, the whole word circuits give a search result of mismatch, since the NMOS transistors N2 and N4 of at least one of the TL-Tcells are both ON, at least one of discharge channels of the global match line ML is ON at this time.

B. If there is only one global X in SL[2n:2n+1]:

According to the decoder, the global mask line GLX=0, GLX_h=0, and the NMOS transistors N1 and N3 are all OFF, the local matching lines LML and LMR each has their own potential respectively; at the same time, it can be seen from table 7, one of search data lines LSL_00 and LSL_11 must be selected, and one of search data lines LSL_01 and LSL_10 must be selected too, one of NMOS transistors M1 and M4 must be ON, and one of NMOS transistors M2 and M3 must be ON too; For example, if SL[2n: 2n+1]={0, X}, then LSL_00 and LSL_01 are selected (=1), M1 and M2 are ON, the value of B-bit [1]# is selected to LML, and the value of B-bit[2]# is selected to LMR, when at least one of local match lines LML and LMR is 0, at least one of NMOS transistors N2 and N4 is OFF, the pull down path of the global match line ML is OFF and the unit comparison result is match; only when local match line LML and LMR are both 1, NMOS transistor N2 and N4 are both ON, the pull down path of the global match line ML is ON and the unit comparison result is mismatch.

C. If there are two global X in SL[2n:2n+1]:

According to the decoder, search data lines LSL_00, LSL_01, LSL_10 and LSL_11 are all 0. NMOS transistors M1, M2, M3 and M4 are all OFF; Global mask lines GLX=1, GLX_h=1, NMOS transistors N1 and N3 are ON, local match lines LML and LMR are both 0; NMOS transistors N2 and N4 are both OFF, the pull down path of the global match line ML is OFF and the unit comparison result is match.

Figure 8:
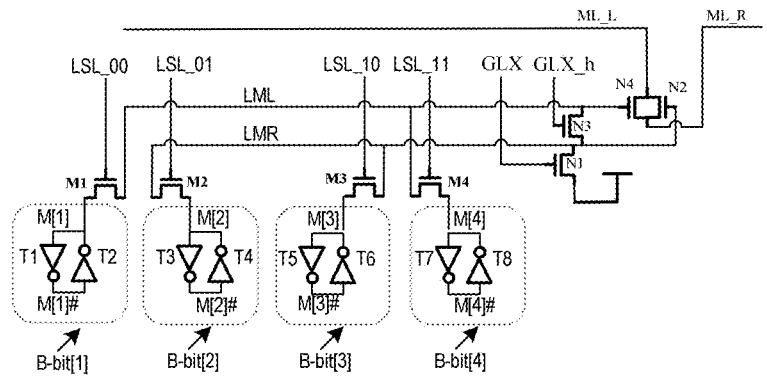
FIG. 8 is a schematic diagram of the unit circuit of the NAND type TL-TCAM hardware search engine.

The NAND type TL-TCAM array is mainly composed of NAND type TL-TCAM hardware search engine word circuit (NAND TL-TCAM word) (as shown in FIG. 10), for the NAND type unit circuit, each word circuit is composed of many hardware search engine unit (TL-Tcells) connected in serial. M is the storage unit B-bit of TL-TCAM, and M # represents the logical NOT of M. M=1 means match, M=0 means mismatch. As shown in FIG. 8, NAND TL-Tcell includes inverters T1~T8, NMOS transistors M1~M4, NMOS transistors N1~N4, search data lines LSL_00, LSL_01, LSL_10, LSL_11, global mask lines GLX, GLX_h, local match lines LML, LMR, global match lines ML_L, M L_R;

The input terminal of inverter T1 is connected to the output terminal of inverter T2 as the data storage terminal M[1] of B-bit[1], the output terminal of inverter T1 is connected to the input terminal of inverter T2 as the logical "NOT" data storage terminal M[1]# of B-bit[1], and the M # terminal is the logical "NOT" of M terminal; the source of MOS transistor M1 is connected to M[1] terminal, and the gate of MOS transistor M1 is connected to the search data line LSL_00, and the drain of MOS transistor M1 is connected to the local match line LML;

The input terminal of inverter T3 is connected to the output terminal of inverter T4 as the data storage terminal M[2] of B-bit[2], the output terminal of inverter T3 is connected to the input terminal of inverter T4 as the logical "NOT" data storage terminal M[2]# of B-bit[2], M[2]# terminal is the logical "NOT" of M[2], the drain of MOS transistor M2 is connected to M[2] terminal, and the gate of MOS transistor M2 is connected to the search data line LSL_01, and the source of MOS transistor M2 is connected to the local match line LMR;

The input terminal of inverter T5 is connected to the output terminal of inverter T6 as the data storage terminal M[3] of B-bit [3], the output terminal of inverter T5 is connected to the input terminal of inverter T6 as the logical "NOT" data storage terminal M[3]# of B-bit [3], M[3]# is the logical "NOT" of M[3], the source of MOS transistor M3 is connected to the M[3] terminal, and the gate of MOS transistor M3 is connected to the search data line LSL_10, and the drain of MOS transistor M3 is connected to the local match line LMR;

The input terminal of inverter T7 is connected to the output terminal of inverter T8 as the data storage terminal M[4] of B-bit[4], the output terminal of inverter T7 is connected to the input terminal of inverter T8 as the logic NOT data storage terminal M[4]# of B-bit[4], M[4]# is the logic NOT of M[4], the drain of MOS transistor M 4 is connected to M[4] terminal, and the gate of MOS transistor M4 is connected to the search data line LSL_11, the source of the MOS transistor M4 is connected to the local match line LML;

The gate of MOS transistor N1 is connected to the global mask line GLX, the source of MOS transistor N1 is connected to the power supply, the drain of MOS transistor N1 is connected to the local match line LMR; the gate of MOS transistor N3 is connected to the global mask line GLX_h, the source of MOS transistor N3 is connected to the match line LMR, the drain of MOS transistor N3 is connected to the match line LML; and the gate of MOS transistor N2 is connected to the match line LMR, the gate of transistor N4 is connected to the local match line LML, the drains of MOS transistors N2 and N4 are connected together, the sources of MOS transistors N2 and N4 are connected together, the drains of MOS transistors N2 and N4 are both connected to the global match line ML_L, and the sources of MOS transistors N2 and N4 are both connected to the global match line ML_R.

The working principle of the NAND type unit circuit is as follows:

A. If there is no global X in SL[2n:2n+1]:

The global mask line GLX=0, GLX_h=1, NMOS transistor N1 is OFF, NMOS transistor N3 is ON, and the voltage of local match line LML and LMR is equal;

Only one of search data lines LSL_00, LSL_01, LSL_10, LSL_11 is 1, and the corresponding M is sent;

If M=1 is sent out, the local match line LML=1 and LMR=1, NMOS transistor N2 and N4 are both ON, and the search result of TL-Tcell unit is match, If all TL-Tcells unit in the word circuit give a result of match, the whole word circuits give a search result of match; if M=0 is sent out, the local match line LML=0 and LMR=0, NMOS transistor N2 and N4 are both OFF, and TL-Tcell gives out a result of mismatch, If at least one of TL-Tcell units in the word circuits gives a result of mismatch, the whole word circuits give a search result of mismatch.

B. If there is only one global X in SL[2n:2n+1]:

According to the decoder, the global mask line GLX=0, GLX_h=0, and the NMOS transistors N1 and N3 are both OFF, the local matching line LML. LMR each has their own potential respectively; at the same time, one of search data lines LSL_00 and LSL_11 must be selected, and one of search data lines LSL_01 and LSL_10 must be selected too, one of NMOS transistors M1 and M4 must be ON, and one of NMOS transistors M2 and M3 must be ON too; at least one of local match lines LML and LMR is 1, at least one of NMOS transistors N2 and N4 is ON, the unit comparison result is match; only when local match line LML and LMR are both 0, NMOS transistor N2 and N4 are both OFF, the unit comparison result is mismatch.

C. If there are two global X in SL[2n:2n+1]:

According to the decoder, search data lines LSL_00, LSL_01, LSL_10 and LSL_11 are all 0. NMOS transistors M1, M2, M3 and M4 are all OFF; global mask lines GLX=1, GLX_h=1, NMOS transistors N1 and N3 are both ON, local match lines LML and LMR are both 1; NMOS transistors N2 and N4 are both ON, the unit comparison result is match.

Figure 1B:
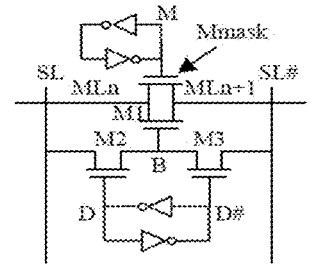
Figure 2A:
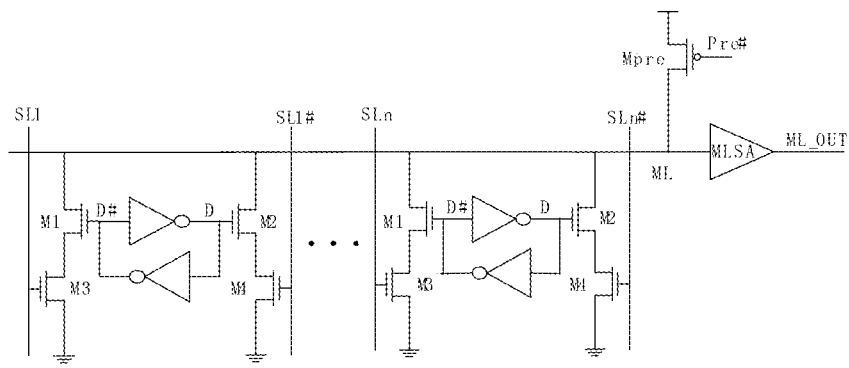
FIG. 2(a) is NOR type match line, FIG. 2 (b) is NAND type match line.
Figure 2B:
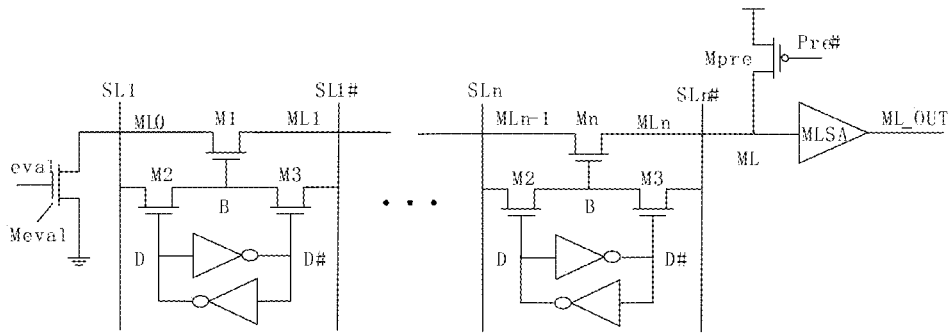
Figure 3:
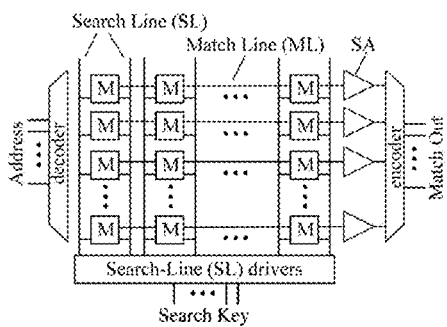
FIG. 3 is a simple CAM block diagram.
Figure 4:
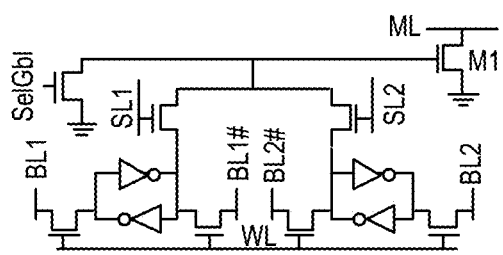
FIG. 4 is a schematic structural diagram of a low parasitic capacitance TCAM.

In the above examples, the unit circuit Tcell of the existing TCAM hardware search engine in FIG. 4 is compared with the unit circuit TL-Tcell of TL-TCAM hardware search engine provided by the present invention in view of circuit structure. Firstly, the power consumption of search line is reduced. Tcell is a 1-bit TCAM unit, while a TL-Tcell is equivalent to 2-bit Tcell. Because the probability of the occurrence of global X is low, we only consider the power consumption when no global X. Because SL={SL, SL #}, SL # is strict logical "NOT" of SL, such as SL=0={0,1}, SL=1={1,0}. According to the average probability, the probability of SL being 0 and 1 is equal in each clock cycle, that is, in each cycle, SL flips from {0,1} to {1,0} or {1,0} to {0,1}. Because flipping from 0 to 1 is power consumption, it is necessary to draw current from the power supply, that is every cycle and every Tcell, there is one SL line power consumption. In the TL-TCAM hardware search engine provided by the present invention, only one line LSL is selected for each cycle in each TL-Tcell. Since one TL-Tcell is equivalent to two Tcells, it can be equivalently considered that the original hardware search engine has one line inversion power consumption per cycle and every two Tcells. Therefore, ideally, the power consumption of the search line SL has been reduced by half. Secondly, the parasitic capacitance of the match line is reduced. From the data conversion part between the lookup table type TL-TCAM hardware search engine and the traditional TCAM hardware search engine, we can see that the storage bits of the TL-TCAM hardware search engine are not increased, which is consistent the original TCAM hardware search engine. For the present invention, ideally, the ML parasitic capacitance is halved, the power consumption is halved, and the speed is doubled for the following reasons: A, NOR type structure. Since TL-Tcell is equivalent to a 2-bit Tcell, in Tcell of FIG. 1 (a), each Tcell has a transistor (M1) connected directly to ML. TL-Tcell in FIG. 7 is equivalent to one transistor N4 connected to ML for every two Tcells. Therefore, the parasitic capacitance is halved, the power consumption is halved, and the speed is doubled. B NAND type structure, compared with Tcell in FIG. 1 (b), NAND type TL-Tcell equivalent to every two Tcells have a transmission gate N2/N4, so the parasitic capacitance is halved, power consumption is reduced, the speed is at least doubled, this is because the speed increased by serial connection mode is nonlinear, the actual speed can even be increased more than double.

What is claimed is:

1. A lookup-table type ternary content-addressable memory (TL-TCAM) hardware search engine comprises an SL decoder, a TL-TCAM array, wherein data stored in the TL-TCAM hardware search engine is obtained by looking up a table of the data stored in a corresponding TCAM hardware search engine, wherein the SL decoder is configured to decode a search word and send the search word to the TL-TCAM array, wherein the SL decoder is to convert a search word SL corresponding to the data in the TCAM hardware search engine table to a search word LSL corresponding to the TL-TCAM hardware search engine table data, wherein the TL-TCAM array comprises a word circuit of TL-TCAM hardware search engine, and each word circuit further comprises a plurality of NOR type TL-TCAM hardware search engine NOR TL-Tcells connected in parallel on a global match line ML, wherein each TL-Tcell is connect to the SL decoder by a search data line and a global mask line, and wherein the SL decoder implements decoding based on the following way:

(1) if there are two global X in SL[2n:2n+1], the search data line LSL_00, LSL_01, LSL_10, LSL_11 are all zero, and the global mask lines GLX and GLX_h are both 1;

(2) if there is only one global X in SL[2n:2n+1], global mask line GLX and GLX_h are 0, and search data lines LSL_00, LSL_01, LSL_10, LSL_11 are the following true value according to the table:

| SL[2n:2n + 1] | LSL_00 | LSL_11 | LSL_10 | LSL_01 |
|---|---|---|---|---|
| 0X | 1 | | | 1 |
| 1X | | 1 | 1 | |
| X0 | 1 | | 1 | |
| X1 | | 1 | | 1 |

(3) If there is no global X in SL[2n:2n+1]:
global mask lines GLX and GLX_h are all 0; if SL[2n:2n+1]=00, the search data line LSL_00=1; if SL[2n:2n+1]=01, the search data line LSL_01=1; if SL[2n:2n+1]=10, the search data line LSL_10=1; if SL[2n:2n+1]=11, the search data line LSL_11=1.

2. The lookup-table type TL-TCAM hardware search engine according to claim 1, wherein based on the following method of carrying out lookup table operations to the data stored in a corresponding TCAM hardware search engine to obtain the data stored in TL-TCAM hardware search engine: grouping every two ternary values bit in a word circuit of the TCAM hardware search engine, each group named as a T_block,
  wherein the T-block is mapped to a TL_block corresponding to the TL-TCAM hardware search engine, each TL_block is composed of 4 binary values bits, and
  wherein each of the T_block is converted to a corresponding TL_block via carrying out the lookup table operations;
  performing the following operations for each T_block:
    using 00 to perform the lookup table operations in the T_block, and a result of whether "match" is taken as a first binary bit B-bit value in the TL_block, named as B-bit[1], and B-bit[1]=1 for matching, otherwise B-bit[1]=0;
    using 01 to perform the lookup table operations in the T_block and the result of whether "match" is taken as a second binary bit B-bit value in the TL_block, named as B-bit[2], and B-bit[2]=1 for matching, otherwise B-bit[2]=0;
    using 10 to perform the lookup table operations in the T_block and the result of whether "match" is taken as a third binary bit B-bit value in the TL_block, named as B-bit[3], and B-bit[3]=1 for matching, otherwise B-bit[3]=0; and
    using 11 to perform the lookup table operations in the T_block and the result of whether "match" is taken as a fourth binary bit B-bit value in the TL_block, named as B-bit[4], and B-bit[4]=1 for matching, otherwise B-bit[4]=0.

3. The lookup-table type TL-TCAM hardware search engine according to claim 1, wherein the NOR TL-Tcells comprises inverters T1~T8, NMOS transistors M1~M4, NMOS transistors N1~N4, search data lines LSL_00, LSL_01, LSL_10, LSL_11, global search lines GLX, GLX_h, local match lines LML, LMR, and the global match line ML; an input terminal of inverter T1 is connected to an output terminal of inverter T2 as a data storage terminal M[1] of B-bit[1], an output terminal of inverter T1 is connected to an input terminal of inverter T2 as a logical "NOT" data storage terminal M[1]# of B-bit[1], and the M # terminal is the logical "NOT" of the M terminal; a source of MOS transistor M1 is connected to the M[1]# terminal, and a gate of MOS transistor M1 is connected to the search data line LSL_00, and a drain of MOS transistor M1 is connected to the local match line LML; an input terminal of inverter T3 is connected to an output terminal of inverter T4 as a data storage terminal M[2] of B-bit[2], an output terminal of inverter T3 is connected to an input terminal of inverter T4 as a logical "NOT" data storage terminal M[2]# of B-bit[2], the M[2]# terminal is the logical "NOT" of M[2] terminal, a drain of MOS transistor M2 is connected to the M[2]# terminal, and a gate of MOS transistor M2 is connected to the search data line LSL_01, and a source of MOS transistor M2 is connected to the local match line LMR; an input terminal of inverter T5 is connected to an output terminal of inverter T6 as a data storage terminal M[3] of B-bit[3], an output terminal of inverter T5 is connected to an input terminal of inverter T6 as a logical "NOT" data storage terminal M[3]# of B-bit[3], M[3]# is the logical "NOT" of M[3], a source of MOS transistor M3 is connected to the M[3]# terminal, a gate of MOS transistor M3 is connected to the search data line LSL_10, and a drain of MOS transistor M3 is connected to the local match line LMR; an input terminal of inverter T7 is connected to an output terminal of inverter T8 as a data storage terminal M[4] of B-bit[4], an output terminal of inverter T7 is connected to an input terminal of inverter T8 as a logical "NOT" data storage terminal M[4]# of B-bit[4], M[4]# is the logical "NOT" of M[4], a drain of MOS transistor M4 is connected to the M[4]# terminal, a gate of MOS transistor M4 is connected to the search data line LSL_11, a source of the MOS transistor M4 is connected to the local match line LML; a gate of MOS transistor N1 is connected to the global mask line GLX, a source of MOS transistor N1 is grounded, a drain of MOS transistor N1 is connected to the match line LMR, a gate of MOS transistor N3 is connected to the global mask line GLX_h, a source of MOS transistor N3 is connected to the local match line LMR, a drain of MOS transistor N3 is connected to the local match line LML; a gate of MOS transistor N2 is connected to the local match line LMR, a source of MOS transistor N2 is grounded; a gate of MOS transistor N4 is connected to the local match line LML, a source of MOS transistor N4 is connected to a drain of MOS transistor N2, and a drain of MOS transistor N4 is connected to the global match line ML.

4. The lookup-table type TL-TCAM hardware search engine according to claim 1, wherein the NOR TL-Tcell works based on the following way:
  if there is no global X in SL[2n:2n+1]:
  global mask line GLX=0, GLX_h=1, NMOS transistor N1 is OFF, NMOS transistor N3 is ON, and the voltage of local match line LML equals to the voltage of LMR;
  only one of the search data lines LSL_00, LSL_01, LSL_10, LSL_11 is 1, and the corresponding M # is sent;
  if M #=0 is sent, the local match line LML=0 and LMR=0, NMOS transistor N2 and N4 are both OFF, and the search result of TL-Tcell unit is "match", if the results of all TL-Tcell units in the word circuit are all matching, the whole word circuit gives a search result of "match", since NMOS transistors N2 and N4 of all TL-Tcell are OFF, all of the discharge channels of the global match line ML are OFF at this time; if M #=1 is sent, the local match line LML=1 and LMR=1, NMOS transistor N2 and N4 are both ON, and search result of the TL-Tcell unit is "mismatch", if at least one of the results of all the TL-Tcells in the word circuit gives a result of "mismatch", the whole word circuit gives a search result of "mismatch", since the NMOS transistors N2 and N4 of at least one of the TL-Tcells are both ON, and at least one of the discharge channels of the global match line ML is ON at this time.

5. The lookup-table type TL-TCAM hardware search engine according to claim 1, wherein the data of the TCAM hardware search engine is obtained based on the following way of mapping data stored in the TL-TCAM hardware search engine: grouping every four binary value bit in a TL-TCAM word circuit, each group named as a TL_block, the TL_block is mapped to a corresponding T_block in the TCAM, wherein each T_block is composed of 2 ternary value bit, and wherein each TL_block is converted to the corresponding T_block via carrying out lookup table operation;
  performing the following operations for each TL_block:
    generating two data A and B, where A is "OR" value of the first and the second column, and B is "OR" value of the third and the fourth column
    if {A, B}=11, the value of the first column of the TCAM table then T-bit[1]=X;

if {A, B}=10, the value of the first column of the TCAM table then T-bit[1]=0;

if {A, B}=01, the value of the first column of the TCAM table then T-bit[1]=1;

regenerating two data M and N, where M is "OR" value of the first and the third column, and N is "OR" value of the second and the fourth column;

if {M, N}=11, the value of the second column of the TCAM table then T-bit[2]=X;

if {M, N}=10, the value of the second column of the TCAM table then T-bit[2]=0; and if {M, N}=01, the value of the second column of the TCAM table then T-bit[2]=1.

6. The lookup-table type TL-TCAM hardware search engine according to claim 1, wherein the NOR TL-Tcell works based on the following way:

if there is only one global X in SL[2n:2n+1]:

according to the SL decoder, the global mask line GLX=0, GLX_h=0, and the NMOS transistors N1 and N3 are all OFF, the local matching lines LML and LMR each have their own potential respectively, while at the same time, one of search data lines LSL_00 and LSL_11 is selected, and one of search data lines LSL_01 and LSL_10 is selected too, one of NMOS transistors M1 and M4 is ON, and one of NMOS transistors M2 and M3 is ON too; and when at least one of LML and LMR is 0, at least one of N2 and N4 is OFF, the pull down path of ML is OFF then a unit comparison result is "match"; and when LML and LMR are both 1, N2 and N4 are both ON, the pull down path of ML is ON, then the unit comparison result is "mismatch".

7. The lookup-table type TL-TCAM hardware search engine according to claim 1, wherein the NOR TL-Tcell works based on the following way:

if there are two global X in SL[2n:2n+1]:

according to the SL decoder, search data lines LSL_00, LSL_01, LSL_10 and LSL_11 are all 0, NMOS transistors M1, M2, M3 and M4 are all OFF, global mask lines GLX=1, GLX_h=1, NMOS transistors N1 and N3 are ON, local match lines LML and LMR are both 0, NMOS transistors N2 and N4 are both OFF, the pull down path of the global match line ML is OFF, then the unit comparison result is "match".

8. A lookup-table type TL-TCAM hardware search engine comprises a SL decoder, a TL-TCAM array, wherein data stored in the TL-TCAM hardware search engine is obtained by looking up a table of the data stored in a corresponding TCAM hardware search engine, wherein the SL decoder is configured to decode a search word and send the search word to the TL-TCAM array, and wherein the SL decoder is to convert a search word SL corresponding to the data in the TCAM hardware search engine table to a search word LSL corresponding to the TL-TCAM hardware search engine table data; and wherein based on the following method of carrying out lookup table operations to the data stored in a corresponding TCAM hardware search engine to obtain the data stored in TL-TCAM hardware search engine:

grouping every two ternary values bit in a word circuit of the TCAM hardware search engine, each group named as a T_block, wherein the T-block is mapped to a TL_block corresponding to the TL-TCAM hardware search engine, each of the TL_block is composed of 4 binary values bits, and wherein each of the T_block is converted to a corresponding TL_block via carrying out the lookup table operations;

performing the following operations for each T_block:

using 00 to perform the lookup table operations in the T_block, and a result of whether "match" is taken as a first binary bit B-bit value in the TL_block, named as B-bit[1], and B-bit[1]=1 for matching, otherwise B-bit[1]=0;

using 01 to perform the lookup table operations in the T_block and the result of whether "match" is taken as a second binary bit B-bit value in the TL_block, named as B-bit[2], and B-bit[2]=1 for matching, otherwise B-bit[2]=0;

using 10 to perform the lookup table operations in the T_block and the result of whether "match" is taken as a third binary bit B-bit value in the TL_block, named as B-bit[3], and B-bit[3]=1 for matching, otherwise B-bit[3]=0; and using 11 to perform the lookup table operations in the T_block and the result of whether "match" is taken as a fourth binary bit B-bit value in the TL_block, named as B-bit[4], and B-bit[4]=1 for matching, otherwise B-bit[4]=0.

9. A lookup-table type ternary content-addressable memory (TL-TCAM) hardware search engine comprises an SL decoder, a TL-TCAM array, wherein data stored in the TL-TCAM hardware search engine is obtained by looking up a table of the data stored in a corresponding TCAM hardware search engine, wherein the SL decoder is configured to decode a search word and send the search word to the TL-TCAM array, wherein the SL decoder is to convert a search word SL corresponding to the data in the TCAM hardware search engine table to a search word LSL corresponding to the TL-TCAM hardware search engine table data, and wherein the data of the TCAM hardware search engine is obtained based on the following way of mapping data stored in the TL-TCAM hardware search engine:

grouping every four binary value bit in a TL-TCAM word circuit, each group named as a TL_block, the TL_block is mapped to a corresponding T_block in the TCAM, wherein each T_block is composed of 2 ternary value bit, and wherein each TL_block is converted to the corresponding T_block via carrying out lookup table operation;

performing the following operations for each TL_block:

generating two data A and B, where A is "OR" value of the first and the second column, and B is "OR" value of the third and the fourth column;

if {A, B}=11, the value of the first column of the TCAM table then T-bit[1]=X;

if {A, B}=10, the value of the first column of the TCAM table then T-bit[1]=0;

if {A, B}=01, the value of the first column of the TCAM table then T-bit[1]=1; and regenerating two data M and N, where M is "OR" value of the first and the third column, and N is "OR" value of the second and the fourth column;

if {M, N}=11, the value of the second column of the TCAM table then T-bit[2]=X;

if {M, N}=10, the value of the second column of the TCAM table then T-bit[2]=0; and if {M, N}=01, the value of the second column of the TCAM table then T-bit[2]=1.

* * * * *